United States Patent
Shimizu et al.

(10) Patent No.: US 9,865,616 B2
(45) Date of Patent: Jan. 9, 2018

(54) SEMICONDUCTOR MEMORY DEVICE AND METHOD FOR MANUFACTURING SAME

(71) Applicant: Toshiba Memory Corporation, Minato-ku (JP)

(72) Inventors: Takashi Shimizu, Nagoya (JP); Hisataka Meguro, Yokkaichi (JP); Shinya Takahashi, Yokkaichi (JP); Ryota Katsumata, Yokkaichi (JP)

(73) Assignee: TOSHIBA MEMORY CORPORATION, Minato-ku (JP)

( * ) Notice: Subject to any disclaimer, the term of this patent is extended or adjusted under 35 U.S.C. 154(b) by 0 days.

(21) Appl. No.: 15/210,446

(22) Filed: Jul. 14, 2016

(65) Prior Publication Data

US 2017/0229474 A1 Aug. 10, 2017

Related U.S. Application Data

(60) Provisional application No. 62/292,955, filed on Feb. 9, 2016.

(51) Int. Cl.

| | |
|---|---|
| *H01L 29/792* | (2006.01) |
| *H01L 27/11582* | (2017.01) |
| *H01L 29/06* | (2006.01) |
| *H01L 27/11568* | (2017.01) |
| *H01L 27/11565* | (2017.01) |

(52) U.S. Cl.
CPC .. *H01L 27/11582* (2013.01); *H01L 27/11565* (2013.01); *H01L 27/11568* (2013.01); *H01L 29/0649* (2013.01)

(58) Field of Classification Search
CPC ......... H01L 27/11582; H01L 27/11568; H01L 27/11565; H01L 29/0649
USPC ........................................................ 257/324
See application file for complete search history.

(56) References Cited

U.S. PATENT DOCUMENTS

| | | | |
|---|---|---|---|
| 8,569,825 B2 | 10/2013 | Iinuma | |
| 8,809,935 B2 | 8/2014 | Tanaka et al. | |
| 8,895,387 B2 | 11/2014 | Sato | |
| 8,896,051 B2* | 11/2014 | Nansei | H01L 27/1157 257/324 |
| 9,087,736 B1* | 7/2015 | Lue | H01L 27/11551 |
| 9,570,464 B1 | 2/2017 | Wakatsuki et al. | |

(Continued)

FOREIGN PATENT DOCUMENTS

| | | |
|---|---|---|
| JP | 2008-277437 | 11/2008 |
| JP | 2012-80133 | 4/2012 |

(Continued)

*Primary Examiner* — Theresa T Doan
(74) *Attorney, Agent, or Firm* — Oblon, McClelland, Maier & Neustadt, L.L.P.

(57) ABSTRACT

A semiconductor memory device according to one embodiment includes a stacked body, a semiconductor pillar and a plurality of charge storage films. The stacked body includes a plurality of electrode films and air gaps. The plurality of electrode films are disposed to be separated from each other along a first direction. Each of the air gaps is made between the electrode films. The semiconductor pillar extends in the first direction and pierces the stacked body. The plurality of charge storage films are provided between the semiconductor pillar and the plurality of electrode films. The plurality of charge storage films are partitioned every electrode film.

15 Claims, 16 Drawing Sheets

(56) References Cited

U.S. PATENT DOCUMENTS

| | | | |
|---|---|---|---|
| 2010/0163968 A1* | 7/2010 | Kim | ................. H01L 27/11582 257/324 |
| 2012/0052674 A1 | 3/2012 | Lee et al. | |
| 2013/0341701 A1 | 12/2013 | Blomme et al. | |
| 2014/0061926 A1 | 3/2014 | Han et al. | |
| 2014/0220750 A1 | 8/2014 | Sohn et al. | |
| 2014/0286098 A1 | 9/2014 | Yasuda | |
| 2014/0308789 A1 | 10/2014 | Kai et al. | |

FOREIGN PATENT DOCUMENTS

| | | |
|---|---|---|
| JP | 2013-128083 | 6/2013 |
| JP | 2013-543266 | 11/2013 |
| JP | 2014-53612 | 3/2014 |
| JP | 2014-165457 | 9/2014 |

\* cited by examiner

SEMICONDUCTOR MEMORY DEVICE AND METHOD FOR MANUFACTURING SAME

CROSS-REFERENCE TO RELATED APPLICATIONS

This application is based upon and claims the benefit of priority from U.S. Provisional Patent Application 62/292,955, filed on Feb. 9, 2016; the entire contents of which are incorporated herein by reference.

FIELD

Embodiments relate to a semiconductor memory device and a method for manufacturing the same.

BACKGROUND

In recent years, a stacked type semiconductor memory device has been proposed in which memory cells are integrated three-dimensionally. In such a stacked type semiconductor memory device, a stacked body in which electrode films and insulating films are stacked alternately is provided on a semiconductor substrate; and a semiconductor pillar that pierces the stacked body is provided. Also, memory cell transistors are formed at each intersection between the semiconductor pillar and the electrode films. Even higher integration is desirable for such a stacked type semiconductor memory device.

DETAILED DESCRIPTION

A semiconductor memory device according to one embodiment includes a stacked body, a semiconductor pillar and a plurality of charge storage films. The stacked body includes a plurality of electrode films and air gaps. The plurality of electrode films are disposed to be separated from each other along a first direction. Each of the air gaps is made between the electrode films. The semiconductor pillar extends in the first direction and pierces the stacked body. The plurality of charge storage films are provided between the semiconductor pillar and the plurality of electrode films. The plurality of charge storage films are partitioned every electrode film.

A semiconductor memory device according to one embodiment includes a stacked body, a semiconductor pillar, a charge storage film and a plurality of capping films. The stacked body includes a plurality of electrode films and air gaps. The plurality of electrode films are disposed to be separated from each other along a first direction. Each of the air gaps is made between the electrode films. The semiconductor pillar extends in the first direction and pierces the stacked body. The charge storage film is provided between the semiconductor pillar and the electrode films. The plurality of capping films are disposed to be separated from each other along the first direction. The electrode films are disposed respectively between the charge storage film and the capping films.

A method for manufacturing a semiconductor memory device according to one embodiment includes forming a stacked body by stacking first films and second films alternately along a first direction. The method includes making a hole extending in the first direction and piercing the stacked body. The method includes forming a charge storage film on a side surface of the hole. The method includes forming a semiconductor pillar on a side surface of the charge storage film. The method includes making a through-portion in the stacked body. The through-portion extends in the first direction. The method includes making first spaces by removing the second films via the through-portion. The method includes forming electrode films inside the first spaces via the through-portion. The method includes making second spaces between the electrode films by removing the first films.

First Embodiment

First, a first embodiment will be described.

Figure 1:
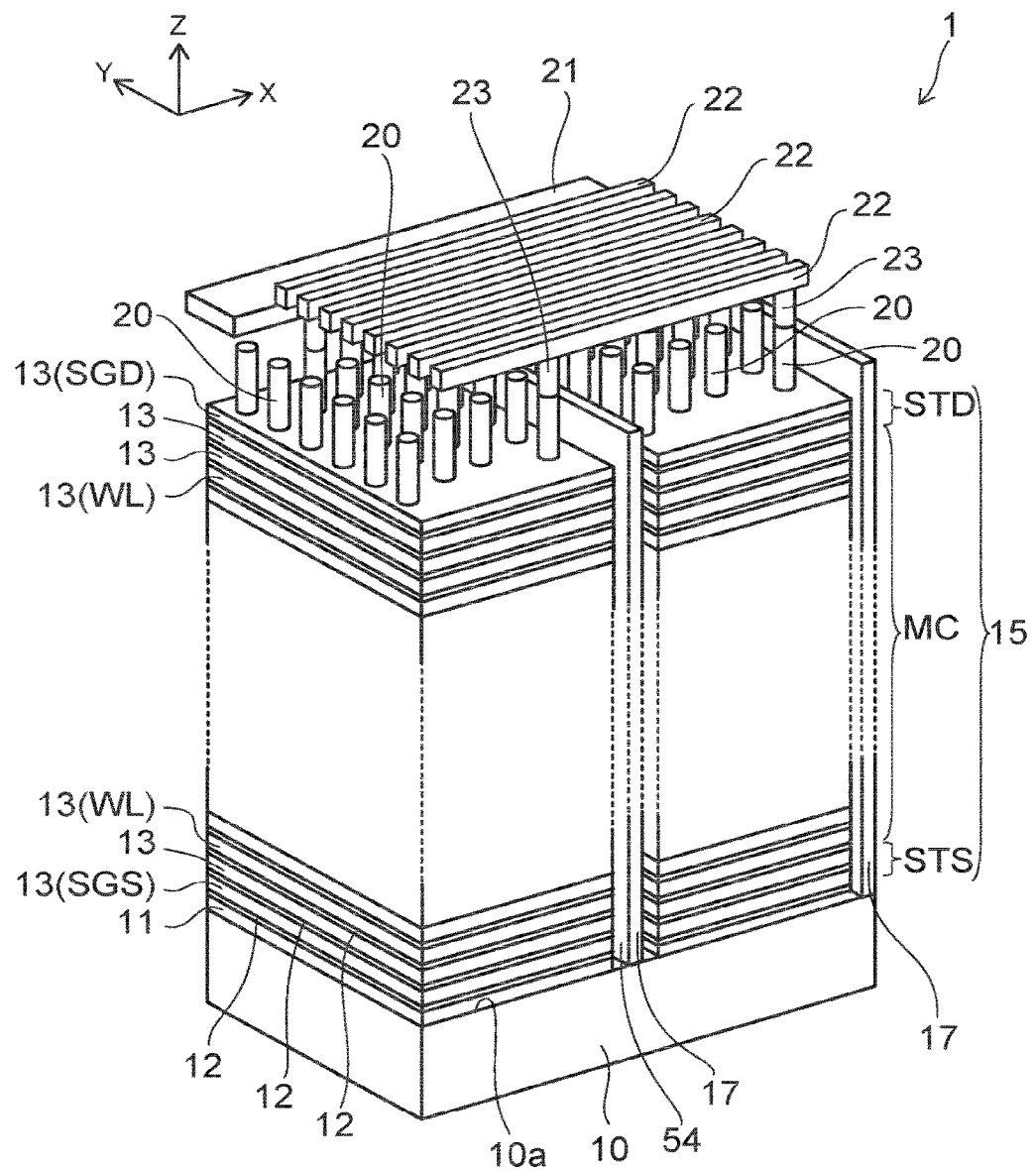
FIG. 1 is a perspective view showing a semiconductor memory device according to a first embodiment.

FIG. 1 is a perspective view showing a semiconductor memory device according to the embodiment.

Figure 2:
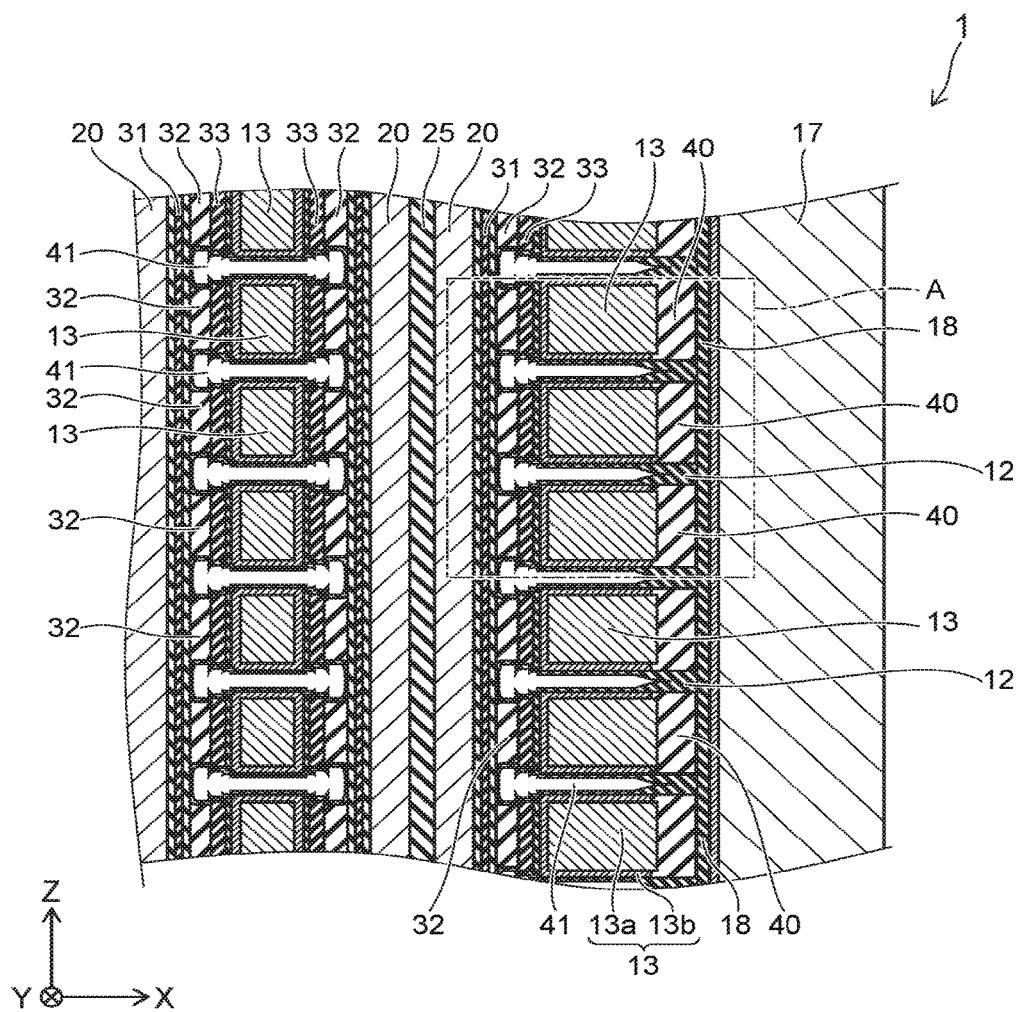
FIG. 2 is a cross-sectional view showing the semiconductor memory device according to the first embodiment.

FIG. 2 is a cross-sectional view showing the semiconductor memory device according to the embodiment.

Figure 3:
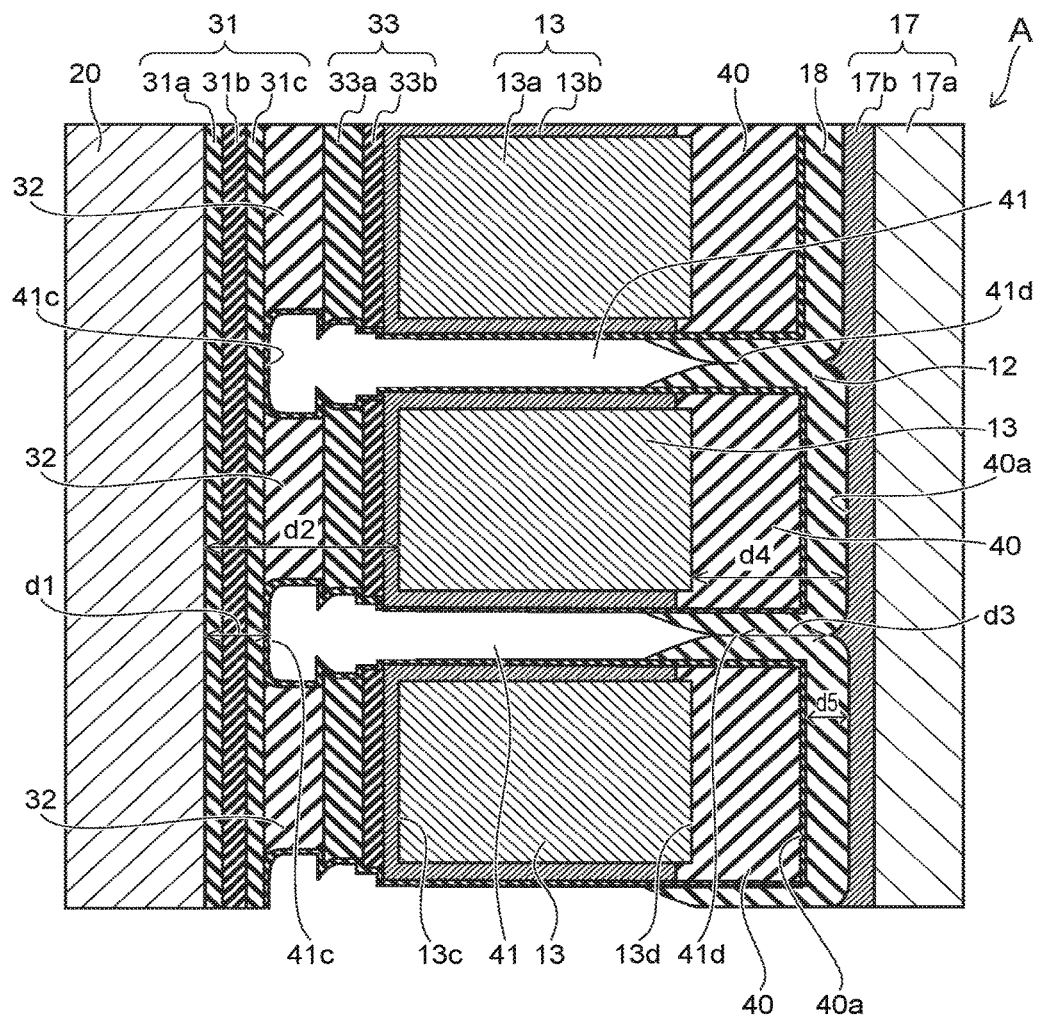
FIG. 3 is a partially enlarged cross-sectional view showing region A of FIG. 2.

FIG. 3 is a partially enlarged cross-sectional view showing region A of FIG. 2.

The semiconductor memory device according to the embodiment is a stacked type nonvolatile semiconductor memory device.

As shown in FIG. 1, a silicon substrate 10 is provided in the semiconductor memory device 1 according to the embodiment.

In the specification hereinbelow, an XYZ orthogonal coordinate system is employed for convenience of description. Two mutually-orthogonal directions parallel to an upper surface 10a of the silicon substrate 10 are taken as an "X-direction" and a "Y-direction;" and a direction perpendicular to the upper surface 10a of the silicon substrate 10 is taken as a "Z-direction." Also, in the specification, although the direction in which the upper surface 10a faces in the Z-direction also is called "up," and the reverse direction also is called "down," this differentiation is for convenience and is independent of the direction of gravity.

A silicon oxide film 11 is provided on the silicon substrate 10. In the specification, "silicon oxide film" refers to a film having silicon oxide (SiO) as a major component. Accordingly, the silicon oxide film 11 includes silicon (Si) and oxygen (O). Also, because silicon oxide generally is an insulating material, the silicon oxide film is an insulating film unless otherwise indicated. This is similar for the other constituents as well; and in the case where the material name is included in the name of the constituent, the material is a major component of the constituent.

Silicon oxide films 12 and Electrode films 13 are stacked alternately along the Z-direction on the silicon oxide film 11.

A stacked body 15 is formed of the silicon oxide film 11, and of the multiple silicon oxide films 12 and the multiple electrode films 13 that are stacked alternately.

Multiple source electrode plates 17 are provided inside the stacked body 15. The configuration of the source electrode plate 17 is a plate configuration; the longest longitudinal direction of the source electrode plate 17 is the Y-direction; the next longest width direction is the Z-direction; and the shortest thickness direction is the X-direction. The lower end of the source electrode plate 17 is connected to the silicon substrate 10.

Silicon pillars 20 that extend in the Z-direction and pierce the stacked body 15 are provided inside the stacked body 15. The silicon pillar 20 is made of polysilicon; and the configuration of the silicon pillar 20 is a circular tube having a plugged lower end portion. The lower end of the silicon pillar 20 is connected to the silicon substrate 10; and the upper end of the silicon pillar 20 is exposed at the upper surface of the stacked body 15. When viewed from the Z-direction, the silicon pillars 20 are arranged periodically along multiple columns, e.g., four columns. Each column extends in the Y-direction; and the positions of the silicon pillars 20 in the Y-direction are shifted one-half period between mutually-adjacent columns.

Multiple bit lines 22 and a source line 21 that extend in the X-direction are provided on the stacked body 15. The bit lines 22 are provided higher than the source line 21. The source line 21 is connected to the upper end of the source electrode plate 17 via a plug (not shown). Also, the bit lines 22 are connected to the upper ends of the silicon pillars 20 via plugs 23. Accordingly, the silicon pillars 20 are connected between the silicon substrate 10 and the bit lines 22.

In the stacked body 15, the electrode film 13 of one or multiple levels from the top functions as an upper selection gate line SGD; and an upper selection gate transistor STD is configured at each intersection between the upper selection gate line SGD and the silicon pillars 20. Also, the electrode film 13 of one or multiple levels from the bottom functions as a lower selection gate line SGS; and a lower selection gate transistor STS is configured at each intersection between the lower selection gate line SGS and the silicon pillars 20. The electrode films 13 other than the lower selection gate line SGS and the upper selection gate line SGD function as word lines WL; and a memory cell transistor MC is configured at each intersection between the word lines WL and the silicon pillars 20. Thereby, a NAND string is formed by the multiple memory cell transistors MC being connected in series along each silicon pillar 20 and by the lower selection gate transistor STS and the upper selection gate transistor STD being connected to the two ends of the multiple memory cell transistors MC.

As shown in FIG. 2, a core member 25 that is made of silicon oxide is provided inside the silicon pillar 20. A tunneling insulating film 31, a charge storage film 32, and a blocking insulating film 33 are provided in this order between the silicon pillar 20 and the electrode film 13 from the silicon pillar 20 toward the electrode film 13. Although the tunneling insulating film 31 normally is insulative, the tunneling insulating film 31 is a film in which a tunneling current flows when a prescribed voltage within the range of the drive voltage of the semiconductor memory device 1 is applied. The charge storage film 32 is a film that can store charge. The blocking insulating film 33 is a film in which a current substantially does not flow even when a voltage within the range of the drive voltage of the semiconductor memory device 1 is applied.

The tunneling insulating film 31 is disposed on substantially the entire side surface of the silicon pillar 20; and the configuration of the tunneling insulating film 31 is a circular tube. The charge storage film 32 and the blocking insulating film 33 are partitioned every electrode film 13; and the configurations of each of the charge storage films 32 and each of the blocking insulating films 33 are circular ring configurations surrounding the silicon pillar 20 and the tunneling insulating film 31. The charge storage films 32 that are arranged along the Z-direction are separated from each other; and the blocking insulating films 33 that are arranged along the Z-direction also are separated from each other.

A silicon oxide plate 18 is provided on the side surfaces of the source electrode plate 17 facing the two X-direction sides. Capping films 40 are provided between the silicon oxide plate 18 and each of the electrode films 13. The capping films 40 respectively contact the electrode films 13. The capping films 40 are arranged along the Z-direction; and the capping films 40 are separated from each other with the silicon oxide film 12 interposed. The capping film 40 is formed of an insulating material that is different from the material of the silicon oxide film 12 and is formed of, for example, silicon nitride. It is sufficient for the capping film 40 to have etching selectivity with the silicon oxide film 12; and the capping film 40 may be formed of, for example, silicon oxide including an impurity, e.g., PSG (Phospho Silicate Glass) or BSG (Boron Silicate Glass).

Then, air gaps 41 are made inside the silicon oxide film 12. The entire inner surface of the air gap 41 is formed of the silicon oxide film 12.

As shown in FIG. 3, an end $41c$ of the air gap 41 on the silicon pillar 20 side is positioned further on the silicon pillar 20 side than is a side surface $13c$ of the electrode film 13 on the silicon pillar 20 side. In other words, a distance d1 between the silicon pillar 20 and the air gap 41 is shorter than a distance d2 between the silicon pillar 20 and the electrode film 13. In other words, d1<d2. The end $41c$ of the air gap 41 is positioned between the charge storage films 32 adjacent to each other in the Z-direction. Accordingly, a portion of the air gap 41 is interposed between the charge storage films 32 adjacent to each other in the Z-direction.

Also, an end $41d$ of the air gap 41 on the source electrode plate 17 side, i.e., the end on the side distal to the silicon pillar 20, is positioned further on the source electrode plate 17 side than is a side surface $13d$ of the electrode film 13 on the source electrode plate 17 side, i.e., the side surface on the side distal to the silicon pillar 20. In other words, a distance d3 between the source electrode plate 17 and the air gap 41 is shorter than a distance d4 between the source electrode plate 17 and the electrode film 13.

Further, the end $41d$ of the air gap 41 is positioned further on the silicon pillar 20 side than is a side surface $40a$ of the capping film 40 on the source electrode plate 17 side. In other words, the distance d3 between the air gap 41 and the source electrode plate 17 is longer than a distance d5 between the capping film 40 and the source electrode plate 17. In other words, d5<d3<d4. The end $41d$ of the air gap 41 is positioned between the capping films 40 adjacent to each other in the Z-direction. Accordingly, a portion of the air gap 41 is interposed between the capping films 40 adjacent to each other in the Z-direction. Therefore, the air gap 41 is interposed over the total length in the X-direction between the electrode films 13 adjacent to each other in the Z-direction.

As shown in FIG. 3, the tunneling insulating film 31 is, for example, an ONO film in which a silicon oxide layer $31a$, a silicon nitride layer $31b$, and a silicon oxide layer $31c$ are stacked in this order. The tunneling insulating film 31 may be a single-layer silicon oxide film. The charge storage film 32 is formed of an insulating material having trap sites of electrons and is formed of, for example, silicon nitride (SiN). The blocking insulating film 33 is, for example, a two-layer film in which a silicon oxide layer 33a and an aluminum oxide layer 33b are stacked. A zirconium oxide layer (ZrO) may be provided instead of the aluminum oxide layer 33b.

A main body unit 13a that is made of a metal such as, for example, tungsten (W), etc., and a barrier metal layer 13b that is made of a metal nitride such as, for example, titanium nitride (TiN), etc., and is provided on the upper surface of the main body unit 13a, on the lower surface of the main body unit 13a, and on the side surface of the main body unit 13a opposing the silicon pillar 20 are provided in the electrode film 13.

A main body unit 17a that is made of, for example, tungsten, and a barrier metal layer 17b that is made of, for example, titanium nitride disposed on the side surfaces of the main body unit 17a facing the two X-direction sides are provided in the source electrode plate 17.

A method for manufacturing the semiconductor memory device according to the embodiment will now be described.

FIG. 4 to FIG. 12 are cross-sectional views showing the method for manufacturing the semiconductor memory device according to the embodiment and show a cross section corresponding to FIG. 3.

First, as shown in FIG. 1, the silicon oxide film 11 is formed on the silicon substrate 10.

Figure 4:
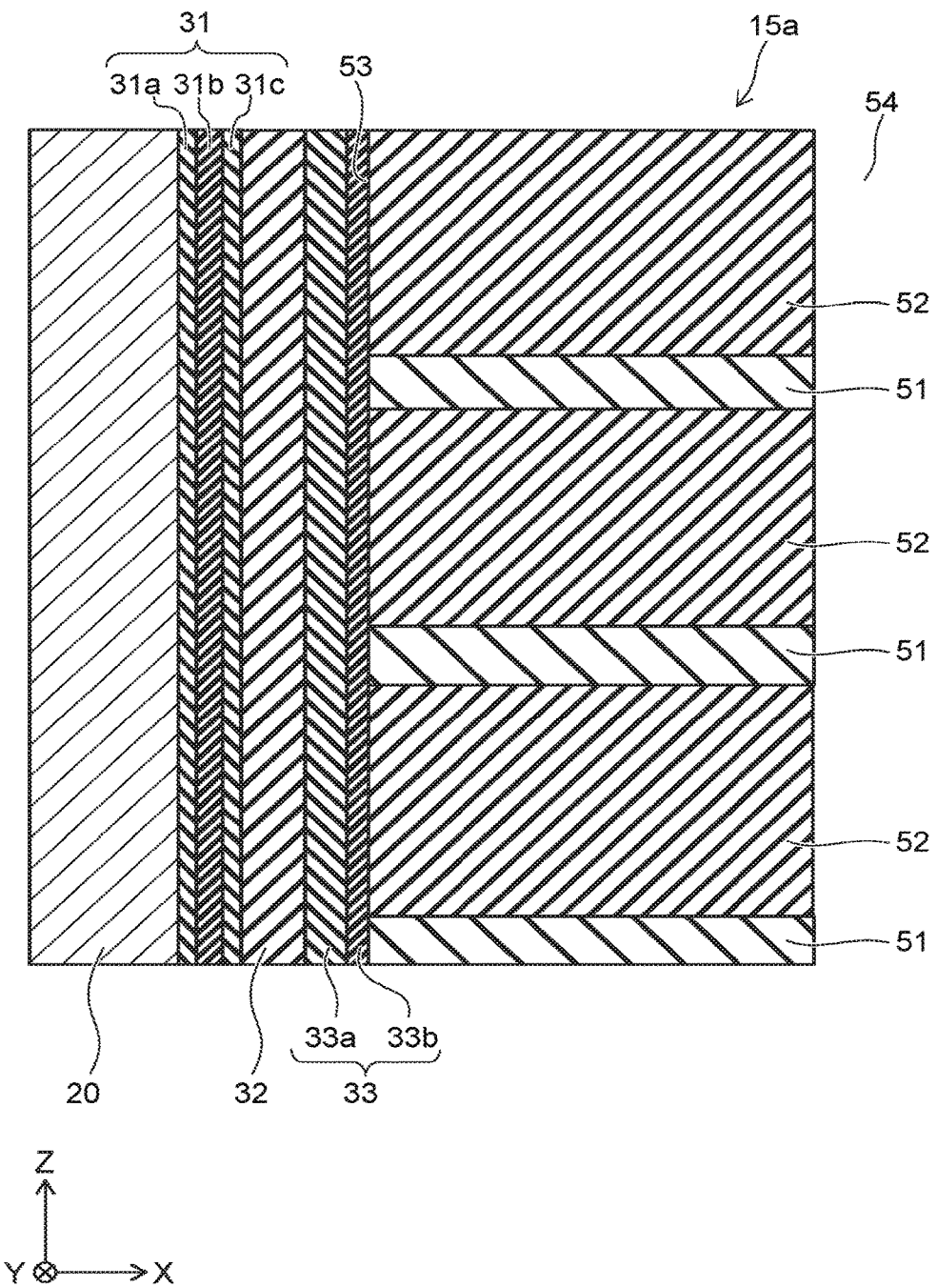
FIG. 4 to FIG. 12 are cross-sectional views showing a method for manufacturing a semiconductor memory device according to the first embodiment.

Then, as shown in FIG. 4, silicon oxide films 51 and silicon nitride films 52 are formed alternately. At this time, the uppermost level is the silicon oxide film 51. A stacked body 15a is formed of the silicon oxide film 11 (referring to FIG. 1), the multiple silicon oxide films 51, and the multiple silicon nitride films 52. Both the silicon oxide film 51 and the silicon nitride film 52 are sacrificial films that are removed in subsequent processes.

Then, a memory hole 53 is made in the stacked body 15a by, for example, lithography and RIE (Reactive Ion Etching). Then, the blocking insulating film 33 is formed by forming the aluminum oxide layer 33b and the silicon oxide layer 33a in this order on the inner surface of the memory hole 53. Then, the charge storage film 32 is formed by depositing silicon nitride on the side surface of the silicon oxide layer 33a. Then, the tunneling insulating film 31 is formed by forming the silicon oxide layer 31c, the silicon nitride layer 31b, and the silicon oxide layer 31a in this order on the side surface of the charge storage film 32.

Then, a cover silicon layer is formed by depositing silicon on the side surface of the tunneling insulating film 31. Then, the silicon substrate 10 is exposed by removing the cover silicon layer, the tunneling insulating film 31, the charge storage film 32, and the blocking insulating film 33 that are on the bottom surface of the memory hole 53 by, for example, RIE. Then, a circular tubular silicon body is formed by depositing silicon. The silicon pillar 20 is formed of the cover silicon layer and a silicon body. Then, by depositing silicon oxide, the core member 25 that is made of silicon oxide (referring to FIG. 2) is filled into the cavity surrounded with the silicon pillar 20. Then, multiple slits 54 that extend in the Y-direction and reach the silicon substrate 10 (referring to FIG. 1) are made in portions of the stacked body 15 where the silicon pillars 20 are not formed.

Figure 5:
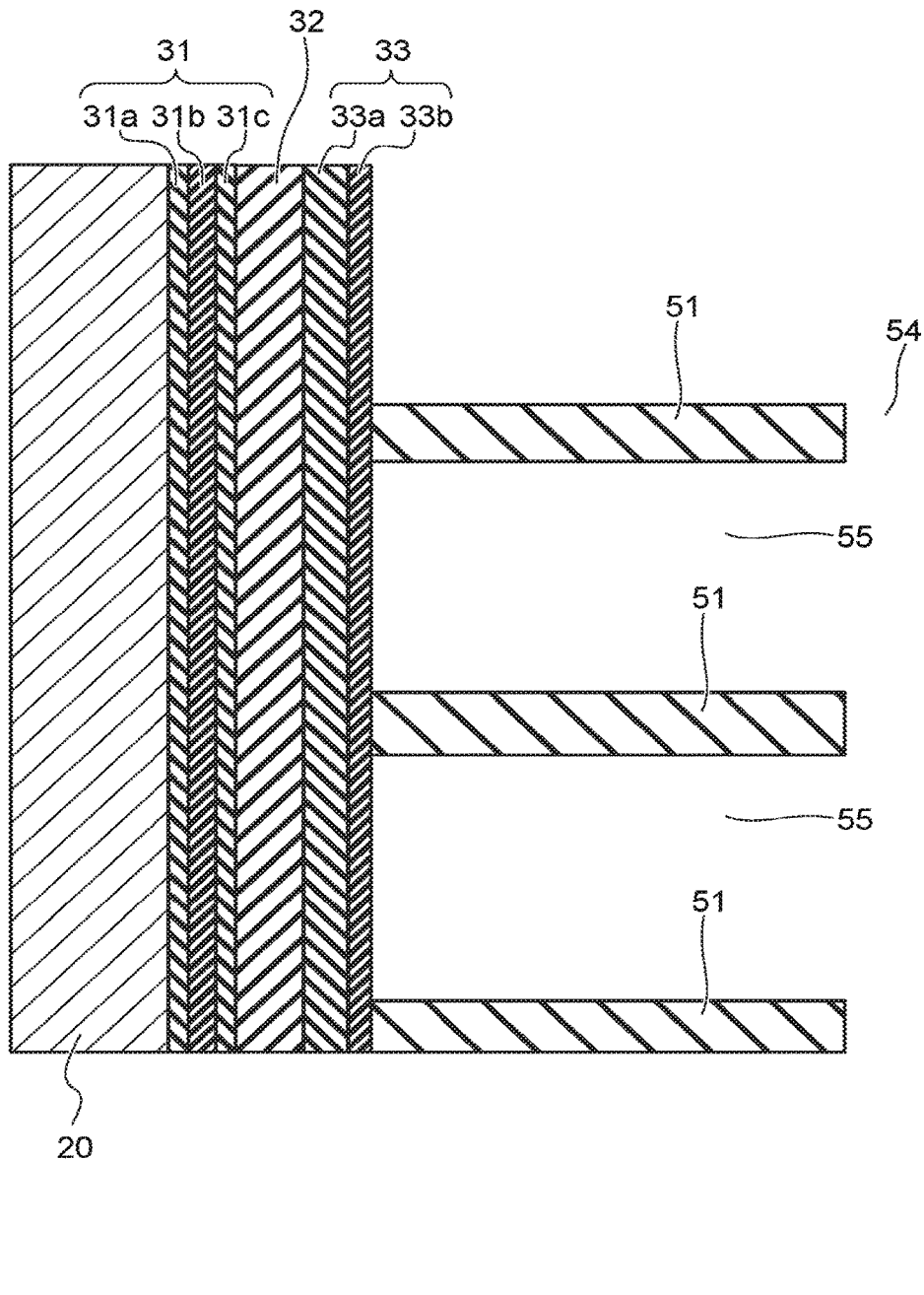

Then, as shown in FIG. 5, wet etching is performed via the slit 54. The conditions of the wet etching are conditions such that silicon nitride is etched selectively with respect to silicon oxide; and, for example, hot phosphoric acid is used as the etchant. Thereby, the silicon nitride film 52 (referring to FIG. 4) is removed via the slit 54; and a space 55 is made. At this time, the silicon oxide films 11 and 51 and the aluminum oxide layer 33b function as an etching stopper and are exposed at the inner surface of the space 55.

Figure 6:
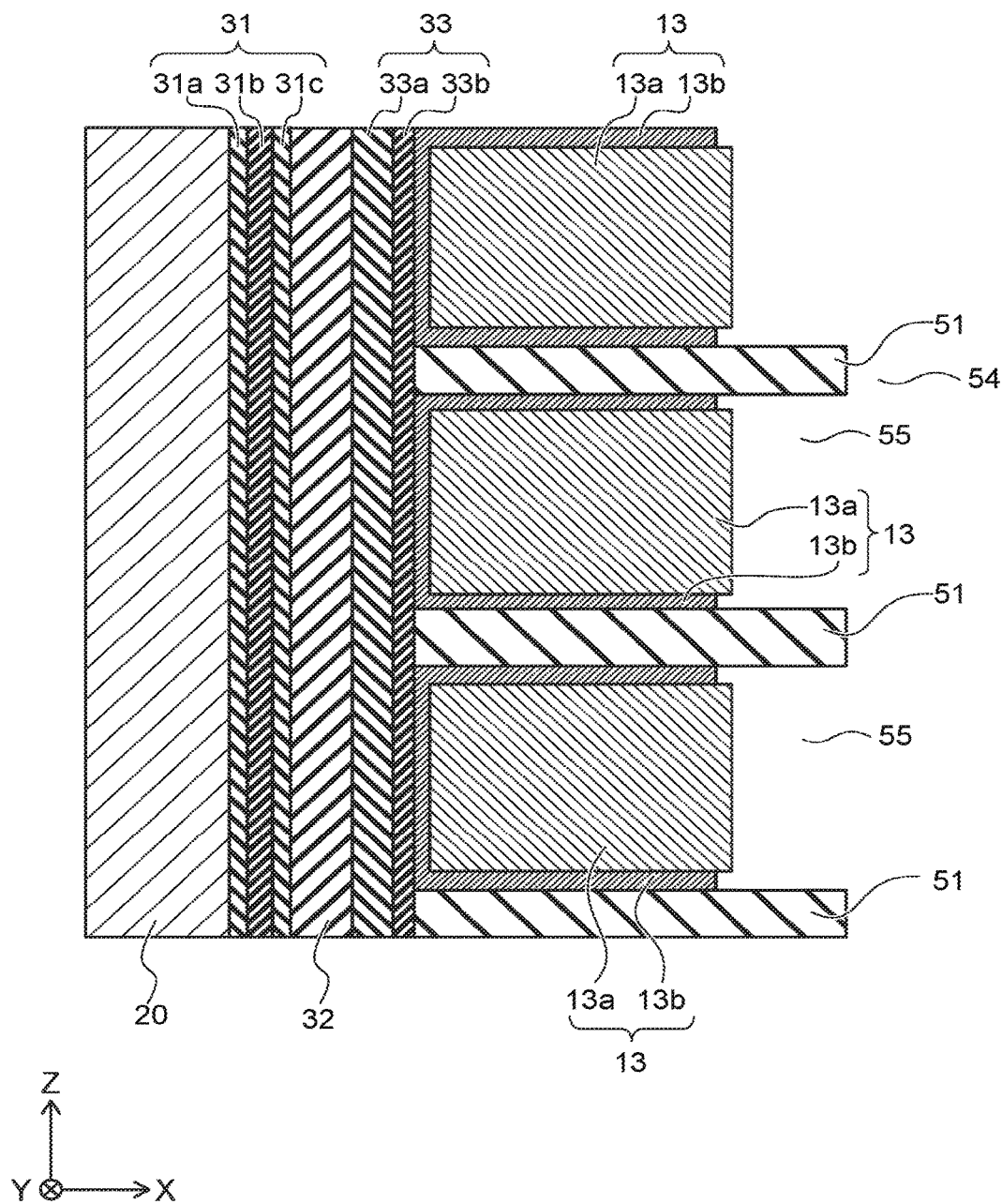

Then, as shown in FIG. 6, a metal nitride, e.g., titanium nitride, is deposited by, for example, CVD (Chemical Vapor Deposition). Thereby, the barrier metal layer 13b is formed on the inner surfaces of the slit 54 and the space 55. Then, the interior of the space 55 is filled by depositing tungsten by, for example, CVD. At this time, the tungsten is deposited also on the side surface of the slit 54. Then, the portions of the barrier metal layer 13b and the tungsten that are deposited inside the slit 54 are removed by etching. Thereby, the tungsten that is filled into the space 55 is divided every space 55 to become the main body unit 13a; and the barrier metal layer 13b is divided every space 55. Thus, the electrode film 13 is formed inside the space 55. At this time, the surface of the electrode film 13 exposed inside the slit 54 recedes further than the surface of the silicon oxide film 51 exposed inside the slit 54.

Figure 7:
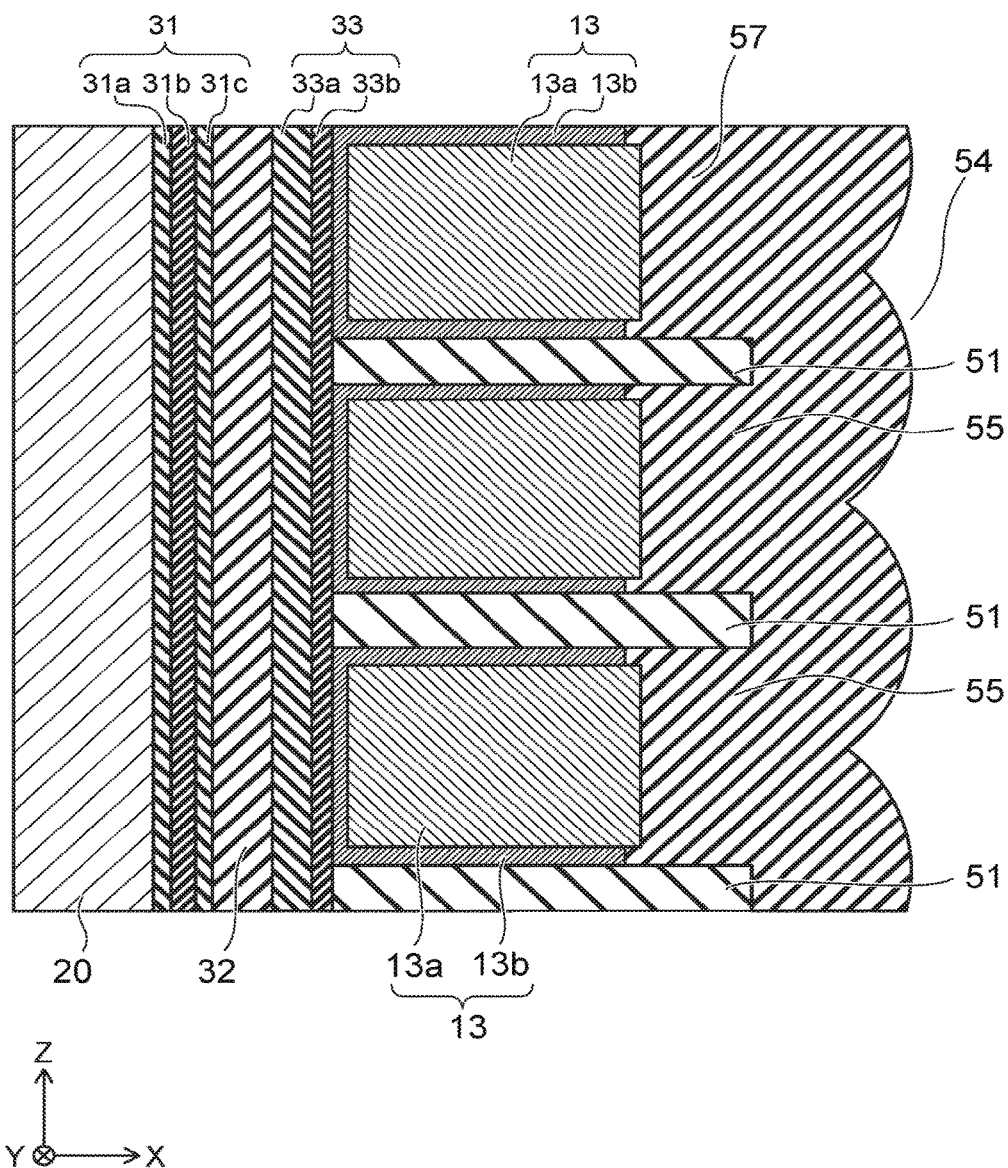

Then, as shown in FIG. 7, a silicon nitride film 57 is formed on the side surface of the slit 54. Instead of forming the silicon nitride film 57, another material that provides etching selectivity with the silicon oxide film 51 may be deposited. It is favorable for the material to be an insulating material; and, for example, silicon oxide including an impurity such as PSG, BSG, etc., may be used.

Figure 8:
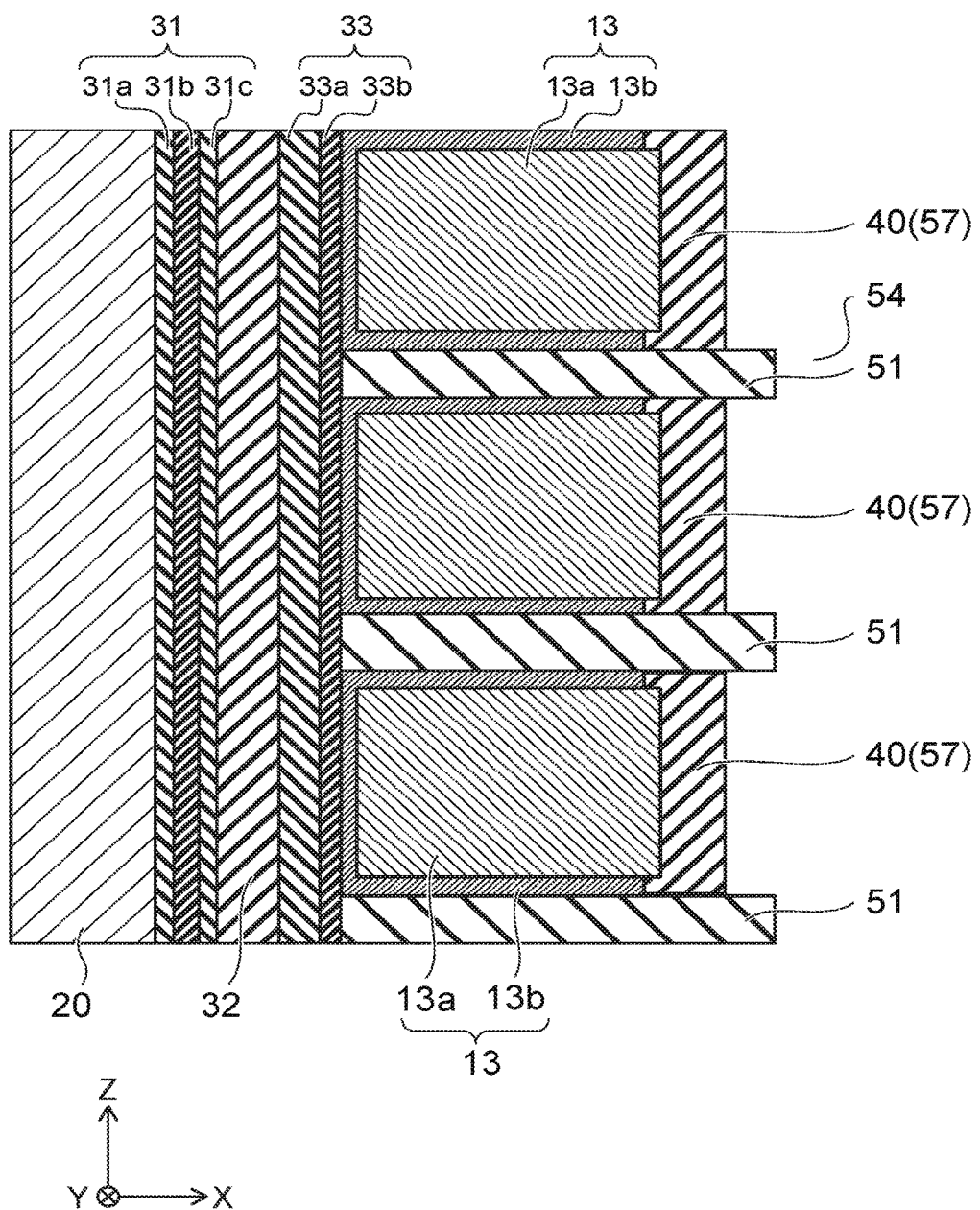

Then, as shown in FIG. 8, etch-back of the silicon nitride film 57 via the slit 54 is performed by etching using conditions such that the etching rate of silicon nitride is higher than the etching rate of silicon oxide. Thereby, the side surface of the silicon nitride film 57 recedes; and the silicon oxide films 51 are exposed inside the slit 54. Also, the silicon nitride film 57 is divided by the silicon oxide films 51 to become the capping films 40.

Figure 9:
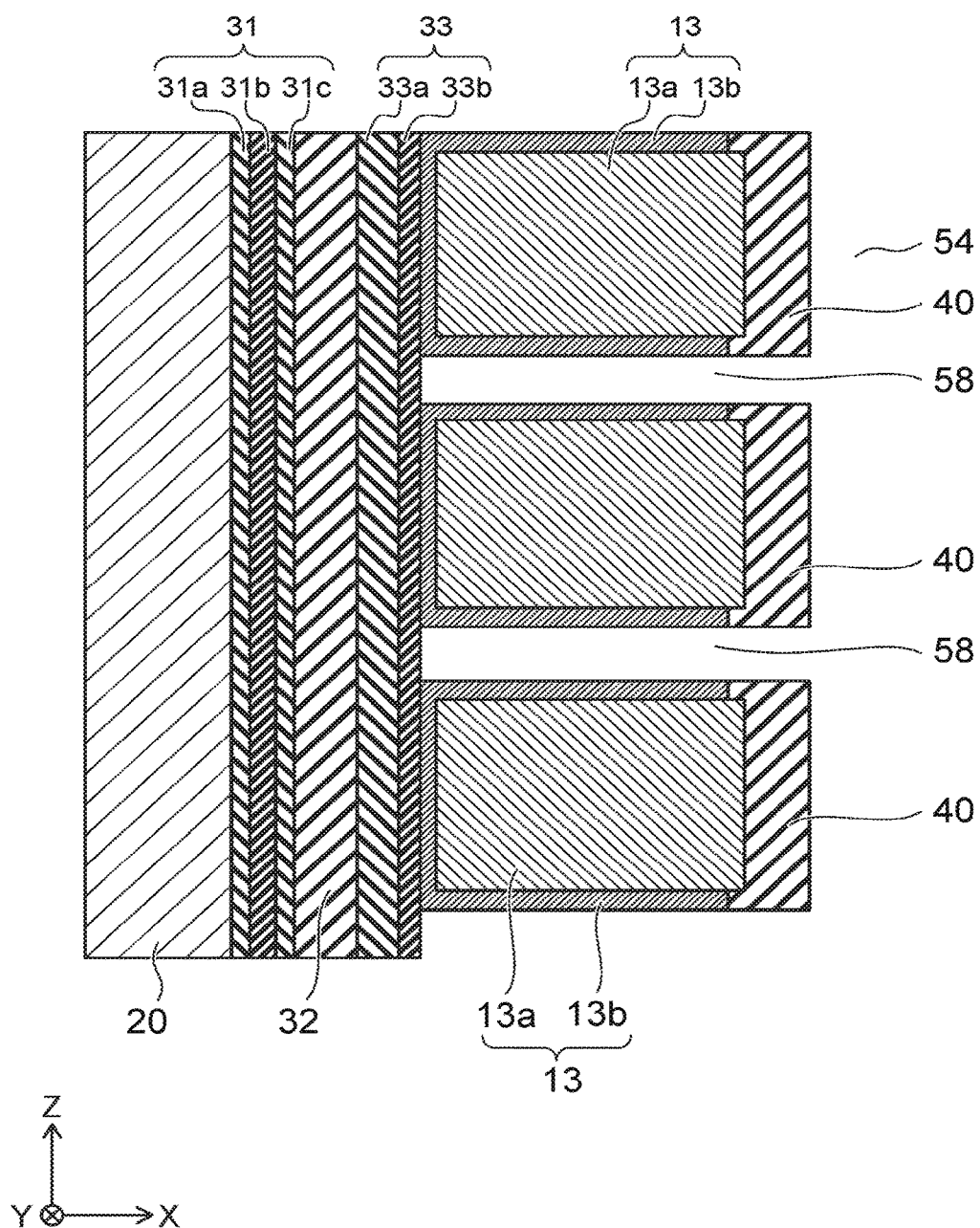

Then, as shown in FIG. 9, the silicon oxide films 51 (referring to FIG. 8) are removed via the slit 54 by etching using conditions such that the etching rate of silicon oxide is higher than the etching rate of silicon nitride. Thereby, a space 58 is made between the electrode films 13 adjacent to each other in the Z-direction.

Figure 10:
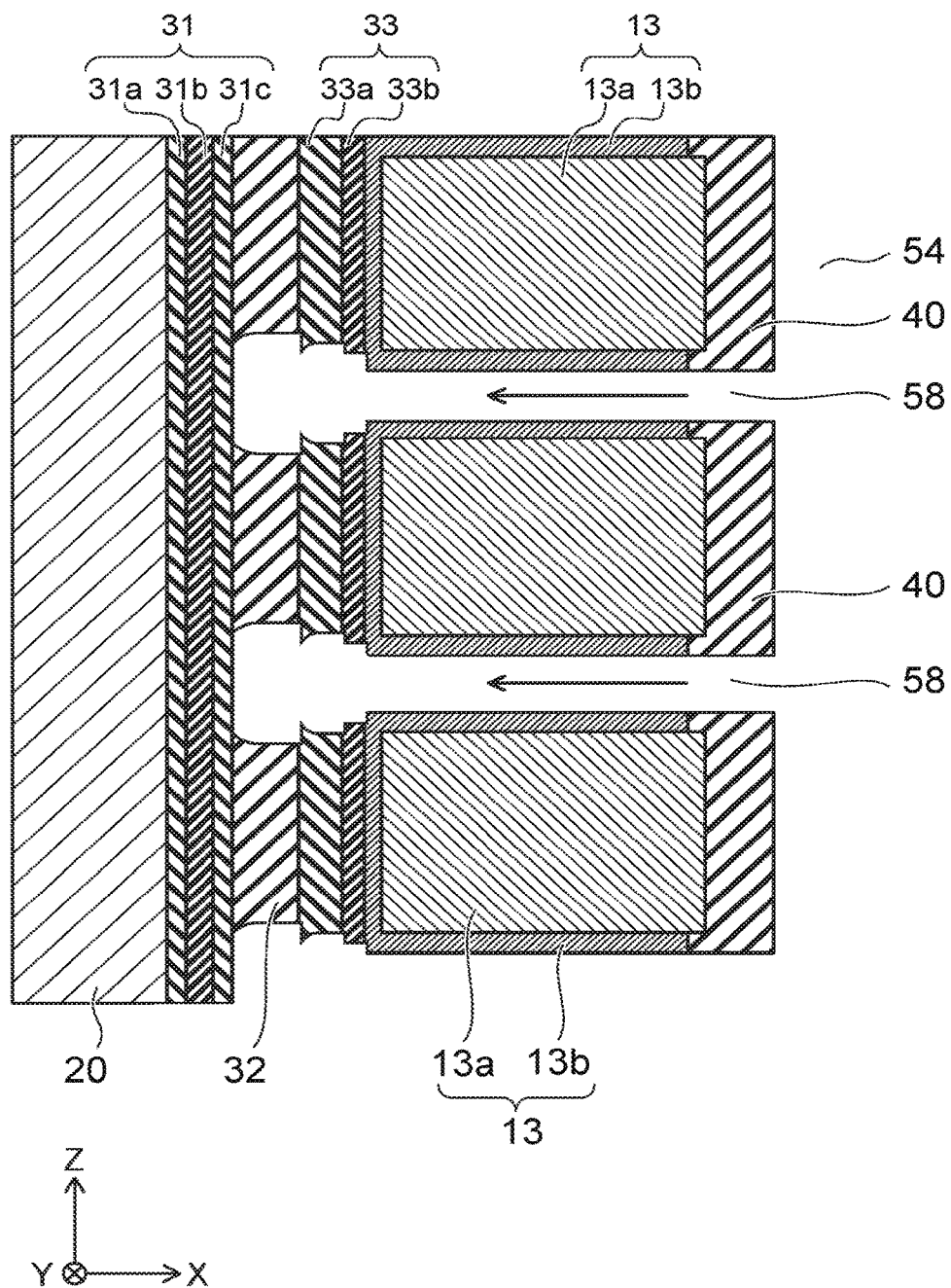

Then, as shown in FIG. 10, etching of the aluminum oxide layer 33b, the silicon oxide layer 33a, and the charge storage film 32 is performed via the slit 54 and the space 58. For example, the etching is performed using isotropic dry etching by performing the etching while changing the conditions according to the etching object. Thereby, the portions of the aluminum oxide layer 33b, the silicon oxide layer 33a, and the charge storage film 32 proximal to the space 58 are removed. As a result, the blocking insulating film 33 and the charge storage film 32 are divided every electrode film 13. At this time, the tunneling insulating film 31 is not divided and is exposed at the back surface of the space 58. In other words, the space 58 extends toward the silicon pillar 20 and reaches the tunneling insulating film 31.

Figure 11:
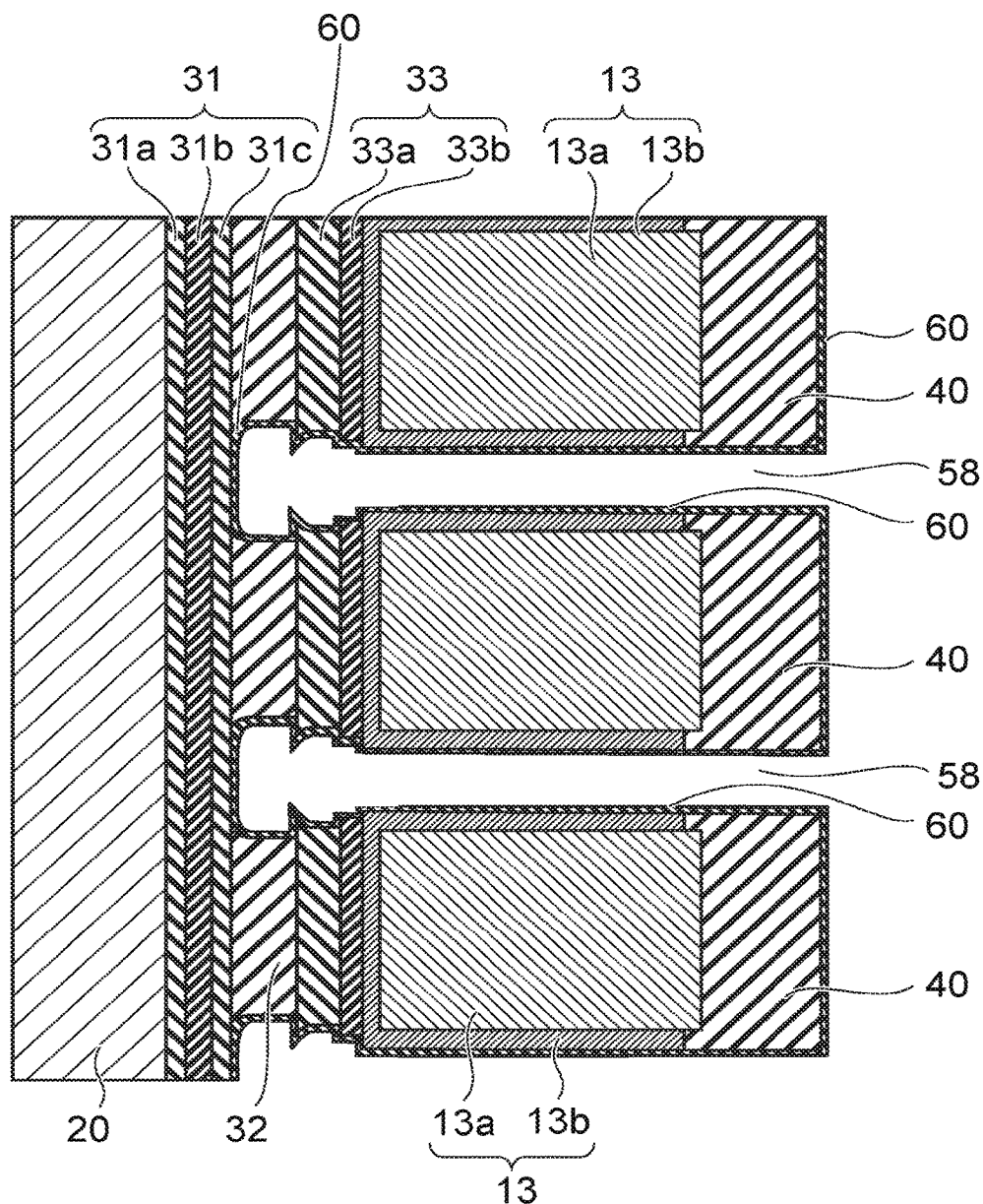

Then, as shown in FIG. 11, silicon oxide is thinly deposited. The depositing is performed using conditions such that the coverage is high, and is performed by, for example, ALD (Atomic Layer Deposition). Thereby, a silicon oxide layer 60 is formed on the inner surfaces of the slit 54 and the space 58.

Figure 12:
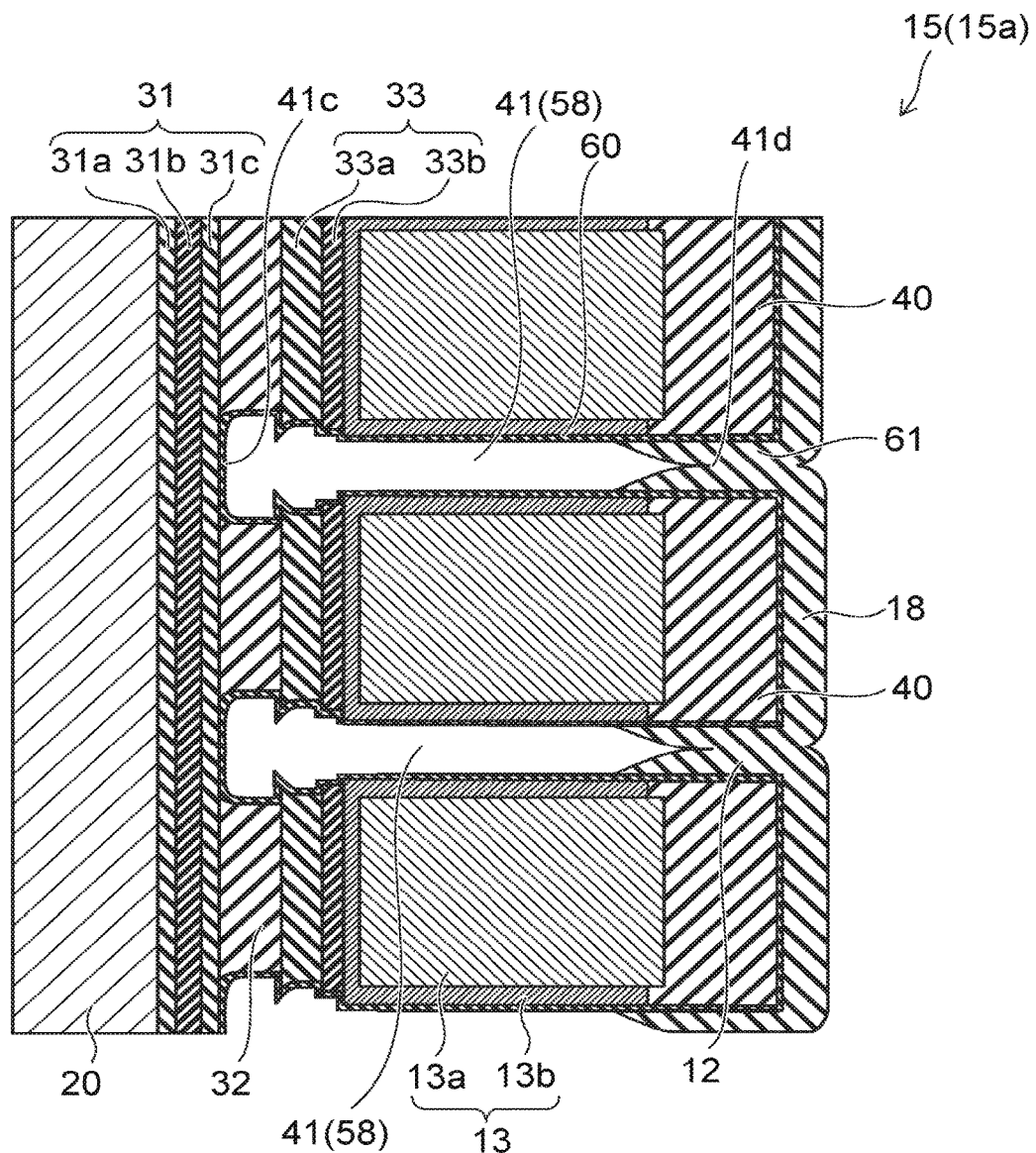

Then, as shown in FIG. 12, silicon oxide is thickly deposited. The depositing is performed using conditions such that the coverage is low, and is performed by, for example, plasma CVD using TEOS (Tetra Ethyl Ortho Silicate: Si(OC$_2$H$_5$)$_4$) as a source material or LP-CVD (Low Pressure Chemical Vapor Deposition) using TEOS as a source material. Thereby, a silicon oxide film 61 is formed on the side surface of the slit 54. Although the silicon oxide film 61 also penetrates into the space 58, the silicon oxide film 61 cannot fill the space 58 and seals the end of the space 58 on the slit 54 side. As a result, the space 58 becomes the air gap 41 that is separated from the slit 54 and sealed. At this time, the end 41*d* of the air gap 41 on the slit 54 side is positioned between the capping films 40 adjacent to each other in the Z-direction. On the other hand, the end 41*c* of the air gap 41 on the silicon pillar 20 side is positioned between the charge storage films 32 adjacent to each other in the Z-direction. Then, the portion of the silicon oxide film 61 deposited on the bottom surface of the slit 54 is removed. Thereby, the silicon substrate 10 (referring to FIG. 1) is exposed at the bottom surface of the slit 54.

The portions of the silicon oxide layer 60 and the silicon oxide film 61 deposited inside the space 58 become the silicon oxide film 12; and the portions of the silicon oxide layer 60 and the silicon oxide film 61 disposed inside the slit 54 become the silicon oxide plate 18. The air gap 41 is disposed inside the silicon oxide film 12. Also, by the processes up to this process, the stacked body 15*a* in which the silicon oxide films 51 and the silicon nitride films 52 are stacked alternately (referring to FIG. 4) is replaced with the stacked body 15 in which the silicon oxide films 12 and the electrode films 13 are stacked alternately.

Then, as shown in FIG. 3, the barrier metal layer 17*b* is formed on the inner surface of the slit 54 by depositing titanium nitride. Then, the main body unit 17*a* is formed by filling, for example, tungsten into the slit 54. The source electrode plate 17 is formed of the barrier metal layer 17*b* and the main body unit 17*a*.

Then, as shown in FIG. 1, an insulating film (not shown) is formed on the stacked body 15; and the plug 23 is formed inside the insulating film. The plug 23 is connected to the silicon pillar 20. Then, the source line 21 that extends in the X-direction is formed on the insulating film and connected to the source electrode plate 17 via a plug (not shown). Also, the bit line 22 that extends in the X-direction is formed on the insulating film and connected to the plug 23. Thus, the semiconductor memory device 1 according to the embodiment is manufactured.

Effects of the embodiment will now be described.

In the semiconductor memory device 1 according to the embodiment as shown in FIG. 3, the distance d1 between the silicon pillar 20 and the air gap 41 is shorter than the distance d2 between the silicon pillar 20 and the electrode film 13. Therefore, the end 41*c* of the air gap 41 on the silicon pillar 20 side is positioned further on the silicon pillar 20 side than is the side surface 13*c* of the electrode film 13 on the silicon pillar 20 side. Also, the distance d3 between the source electrode plate 17 and the air gap 41 is shorter than the distance d4 between the source electrode plate 17 and the electrode film 13. Therefore, the end 41*d* of the air gap 41 on the source electrode plate 17 side is positioned further on the source electrode plate 17 side than is the side surface 13*d* of the electrode film 13 on the source electrode plate 17 side. Thereby, in the XZ cross section including the silicon pillar 20, the air gap 41 is disposed over the entire X-direction length of the region between the electrode films 13 adjacent to each other in the Z-direction.

As a result, in the XZ cross section including the silicon pillar 20, the air gap 41 always is interposed in the straight path from one electrode film 13 toward an adjacent electrode film 13. Therefore, paths of leakage current do not form easily; and the breakdown voltage between the electrode films 13 is high. Also, because the air gap 41 that has the low dielectric constant is interposed between the electrode films 13, the parasitic capacitance between the electrode films 13 is small. When the parasitic capacitance between the electrode films 13 is small, the RC delay is small; and the operation speed of the semiconductor memory device 1 is fast. In other words, the distance between the electrode films 13 can be reduced while ensuring a breakdown voltage not less than a prescribed value and a parasitic capacitance not more than a prescribed value. Thereby, higher integration of the memory cell transistors MC can be realized by increasing the number of stacks of the electrode films 13 while suppressing the height of the entire stacked body 15 to be a height at which it is possible to make the memory hole 53 (referring to FIG. 4) and the slit 54 (referring to FIG. 4) while maintaining a realistic cost.

Also, because the charge storage film 32 is divided every electrode film 13, the movement of the electrons stored in the charge storage film 32 of one memory cell transistor MC into the charge storage film 32 of a memory cell transistor MC adjacent in the Z-direction can be suppressed. Accordingly, the data retention of the semiconductor memory device 1 according to the embodiment is high. In other words, higher integration of the memory cell transistors MC can be realized by reducing the distance between the electrode films 13 while ensuring the necessary data retention.

Further, in the semiconductor memory device 1, because the capping film 40 that is insulative is provided between the electrode film 13 and the source electrode plate 17, the breakdown voltage between the electrode film 13 and the source electrode plate 17 is high. Also, the charge storage film 32 and the capping film 40 can be protected because the silicon oxide layer 60 covers the capping film 40 and the charge storage film 32 made of silicon nitride at the inner surface of the air gap 41. As a result, the reliability of the semiconductor memory device 1 is high.

Also, in the method for manufacturing the semiconductor memory device according to the embodiment, the stacked body 15 is formed by forming the stacked body 15*a* by stacking the silicon oxide films 51 and the silicon nitride films 52 as two types of sacrificial films in the process shown in FIG. 4, by replacing the silicon nitride films 52 with the electrode films 13 in the processes shown in FIG. 5 and FIG. 6, and by replacing the silicon oxide films 51 with the silicon oxide films 12 containing the air gap 41 in the processes shown in FIG. 9 to FIG. 12. Thereby, the air gap 41 can be made between the electrode films 13.

Further, in the embodiment, because the space 58 that becomes the air gap 41 in a subsequent process is made from the slit 54 side as shown in FIG. 9, the charge storage film 32 can be divided by etching the charge storage film 32 via the space 58 in the process shown in FIG. 10.

Further, in the embodiment, the capping film 40 is formed on the slit 54 side of the electrode film 13 by the processes shown in FIG. 6 to FIG. 9; and the air gap 41 is made by sealing the end of the space 58 with the silicon oxide film 61 in the process shown in FIG. 12. Thereby, the end 41*d* of the air gap 41 on the slit 54 side can be positioned further on the slit 54 side than is the side surface 13*d* of the electrode film 13 on the slit 54 side.

Although an example is illustrated in the embodiment in which the silicon oxide layer 60 is formed by deposition such as ALD, etc., this is not limited thereto; and, for example, the silicon oxide layer 60 may be formed by oxidation treatment such as radical oxidation treatment, thermal oxidation treatment, etc. In such a case, the aluminum oxide layer 33b and the barrier metal layer 13b made of titanium nitride are exposed at the inner surface of the air gap 41.

Second Embodiment

A second embodiment will now be described.

Figure 13:
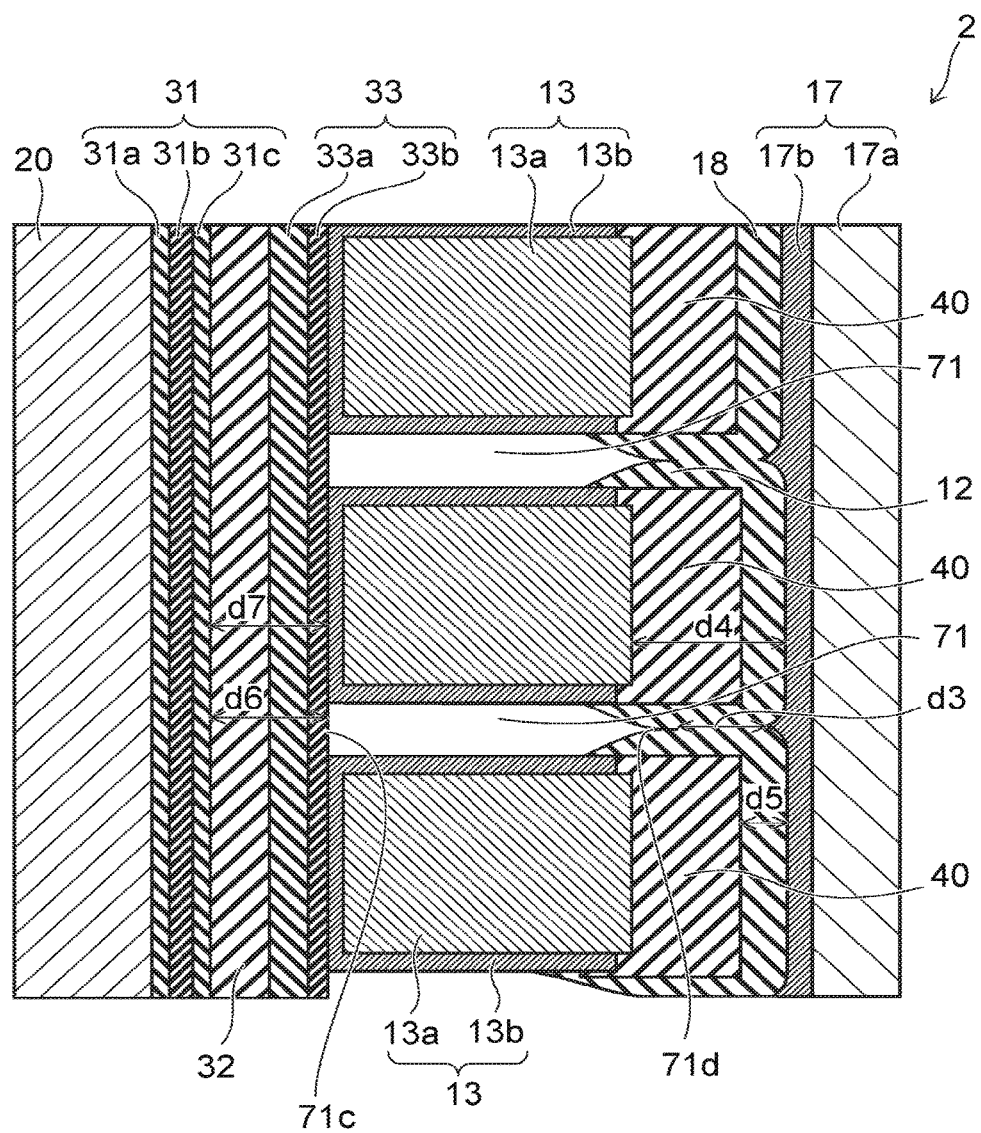
FIG. 13 is a cross-sectional view showing a semiconductor memory device according to a second embodiment.

FIG. 13 is a cross-sectional view showing a semiconductor memory device according to the embodiment.

FIG. 13 shows a cross section corresponding to FIG. 3.

As shown in FIG. 13, the semiconductor memory device 2 according to the embodiment differs from the semiconductor memory device 1 according to the first embodiment described above (referring to FIG. 1 to FIG. 3) in that the charge storage film 32 and the blocking insulating film 33 are not divided every electrode film 13, and the silicon oxide layer 60 (referring to FIG. 11) is not provided. The configurations of the charge storage film 32 and the blocking insulating film 33 are circular tubes surrounding the silicon pillar 20.

The inner surface of an air gap 71 includes the silicon oxide film 12, the barrier metal layer 13b, and the aluminum oxide layer 33b. Also, an end 71c of the air gap 71 on the silicon pillar 20 side is positioned on the side surface of the blocking insulating film 33 on the electrode film 13 side; and a distance d6 between the silicon pillar 20 and the air gap 71 is substantially equal to a distance d7 between the silicon pillar 20 and the electrode film 13. In other words, d6≈d7. On the other hand, similarly to the first embodiment described above, the distance d3 between the source electrode plate 17 and the air gap 71 is shorter than the distance d4 between the source electrode plate 17 and the electrode film 13 and longer than the distance d5 between the capping film 40 and the source electrode plate 17. In other words, d5<d3<d4.

Otherwise, the configuration of the embodiment is similar to that of the first embodiment described above.

The semiconductor memory device according to the embodiment can be manufactured as follows.

First, the processes shown in FIG. 4 to FIG. 9 are implemented. Then, the process shown in FIG. 12 is implemented without implementing the processes shown in FIG. 10 and FIG. 11. Otherwise, the manufacturing method of the embodiment is similar to that of the first embodiment described above.

According to the embodiment, compared to the first embodiment described above, because the processes shown in FIG. 10 and FIG. 11 can be omitted, the manufacturing is easy; and the productivity is high. Also, in the embodiment as well, similarly to the first embodiment described above, because the air gap 71 is disposed over the entire X-direction length of the region between the electrode films 13 adjacent to each other in the Z-direction in the XZ cross section including the silicon pillar 20, the breakdown voltage between the electrode films 13 is high; and the parasitic capacitance is small.

Third Embodiment

A third embodiment will now be described.

Figure 14:
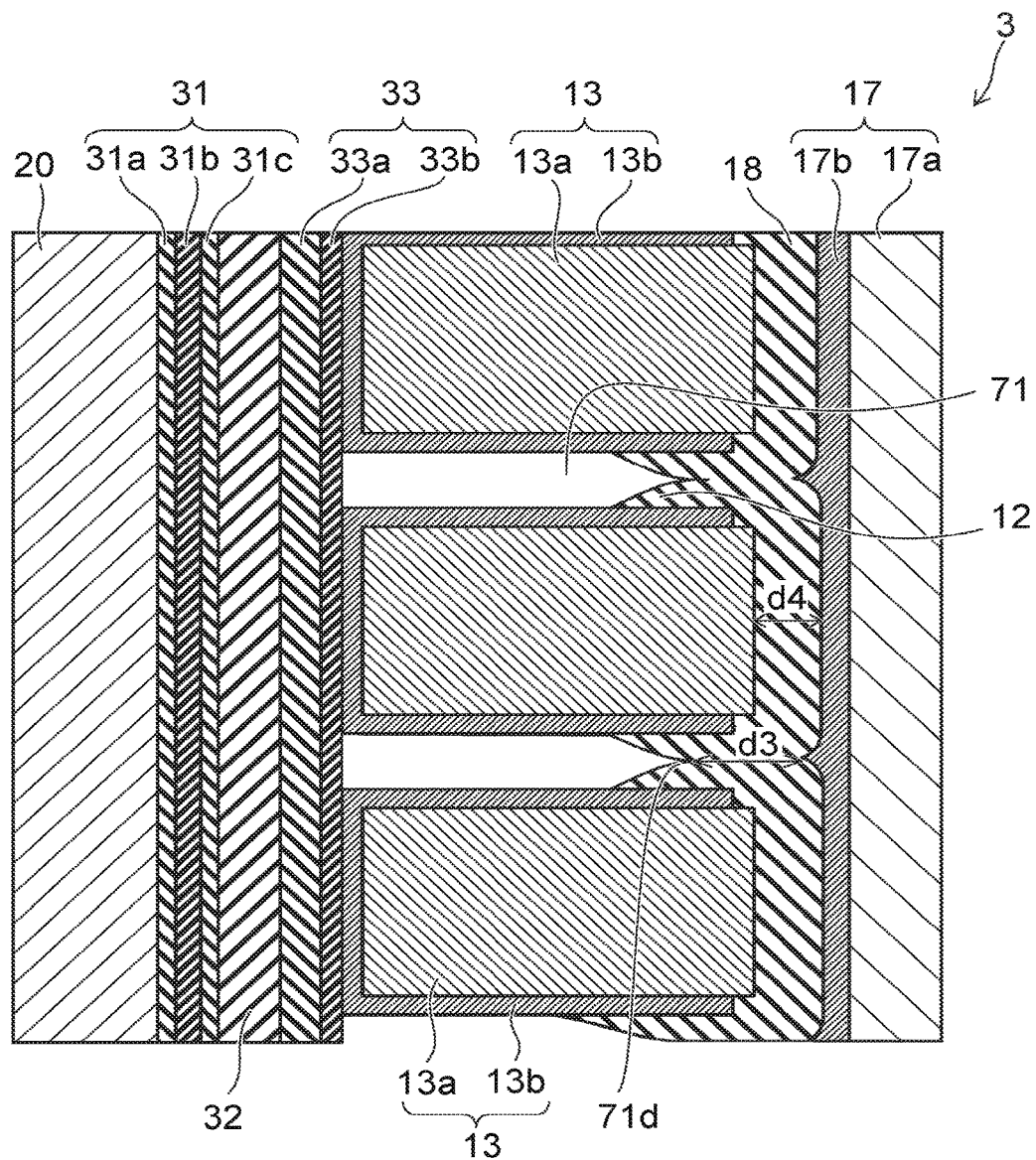
FIG. 14 is a cross-sectional view showing a semiconductor memory device according to a third embodiment.

FIG. 14 is a cross-sectional view showing a semiconductor memory device according to the embodiment.

FIG. 14 shows a cross section corresponding to FIG. 3.

As shown in FIG. 14, the semiconductor memory device 3 according to the embodiment differs from the semiconductor memory device 2 according to the second embodiment described above (referring to FIG. 13) in that the capping film 40 is not provided. In the semiconductor memory device 3, an end 17d of the air gap 71 on the source electrode plate 17 side is further on the silicon pillar 20 side than is the surface 13d of the electrode film 13 on the source electrode plate 17 side. In other words, the distance d3 between the source electrode plate 17 and the air gap 71 is longer than the distance d4 between the source electrode plate 17 and the electrode film 13; and d3>d4. Otherwise, the configuration of the embodiment is similar to that of the second embodiment described above.

A method for manufacturing the semiconductor memory device according to the embodiment will now be described.

Figure 15:
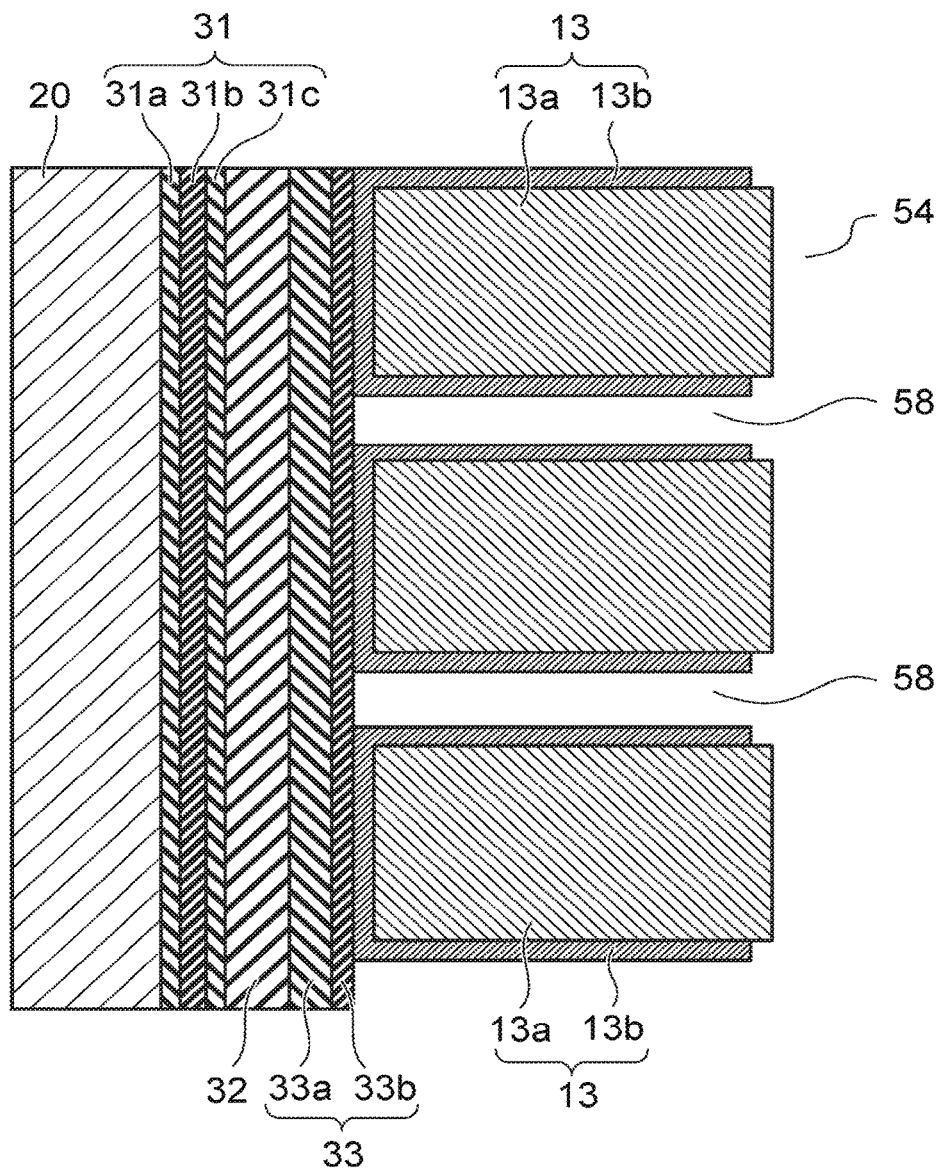
FIG. 15 is cross-sectional view showing a method for manufacturing a semiconductor memory device according to the third embodiment.

FIG. 15 is a cross-sectional view showing the method for manufacturing the semiconductor memory device according to the embodiment.

First, the processes shown in FIG. 4 and FIG. 5 are implemented.

Then, as shown in FIG. 6, for example, the electrode films 13 are formed inside the space 55 by depositing titanium nitride and tungsten and by performing etch-back. At this time, the etch-back amount is less than those of the first and second embodiments described above; and the receded amount of the surfaces of the electrode films 13 exposed inside the slit 54 is less than those of the first and second embodiments described above.

Then, without implementing the formation process of the capping films 40 shown in FIG. 7 and FIG. 8, the silicon oxide films 51 (referring to FIG. 6) are removed via the slit 54 by etching using conditions such that the etching rate of silicon oxide is higher than the etching rate of silicon nitride as shown in FIG. 15. Thereby, the space 58 is made between the electrode films 13 adjacent to each other in the Z-direction.

Then, without implementing the dividing process of the charge storage film 32 shown in FIG. 10 and FIG. 11, silicon oxide is deposited thickly using conditions providing low coverage as shown in FIG. 14. Thereby, the silicon oxide film 61 is formed on the side surface of the slit 54; and the end of the space 58 on the slit 54 side is sealed. As a result, the space 58 becomes the air gap 71. However, because the capping film 40 does not exist, the end 17d of the air gap 71 on the source electrode plate 17 side is positioned between the electrode films 13 adjacent to each other in the Z-direction.

The subsequent processes are similar to those of the first embodiment described above. Thus, the semiconductor memory device 3 that does not include the capping film 40 is manufactured. Otherwise, the manufacturing method of the embodiment is similar to that of the second embodiment described above.

According to the embodiment, compared to the second embodiment described above, because the processes shown in FIG. 7 and FIG. 8 can be omitted, the manufacturing is easy; and the productivity is higher. Also, because the air gap 71 is made in a portion of the region between the electrode films 13 adjacent to each other in the Z-direction, the effect of increasing the breakdown voltage between the electrode films 13 and the effect of reducing the parasitic capacitance can be obtained somewhat.

Fourth Embodiment

A fourth embodiment will now be described.

Figure 16:
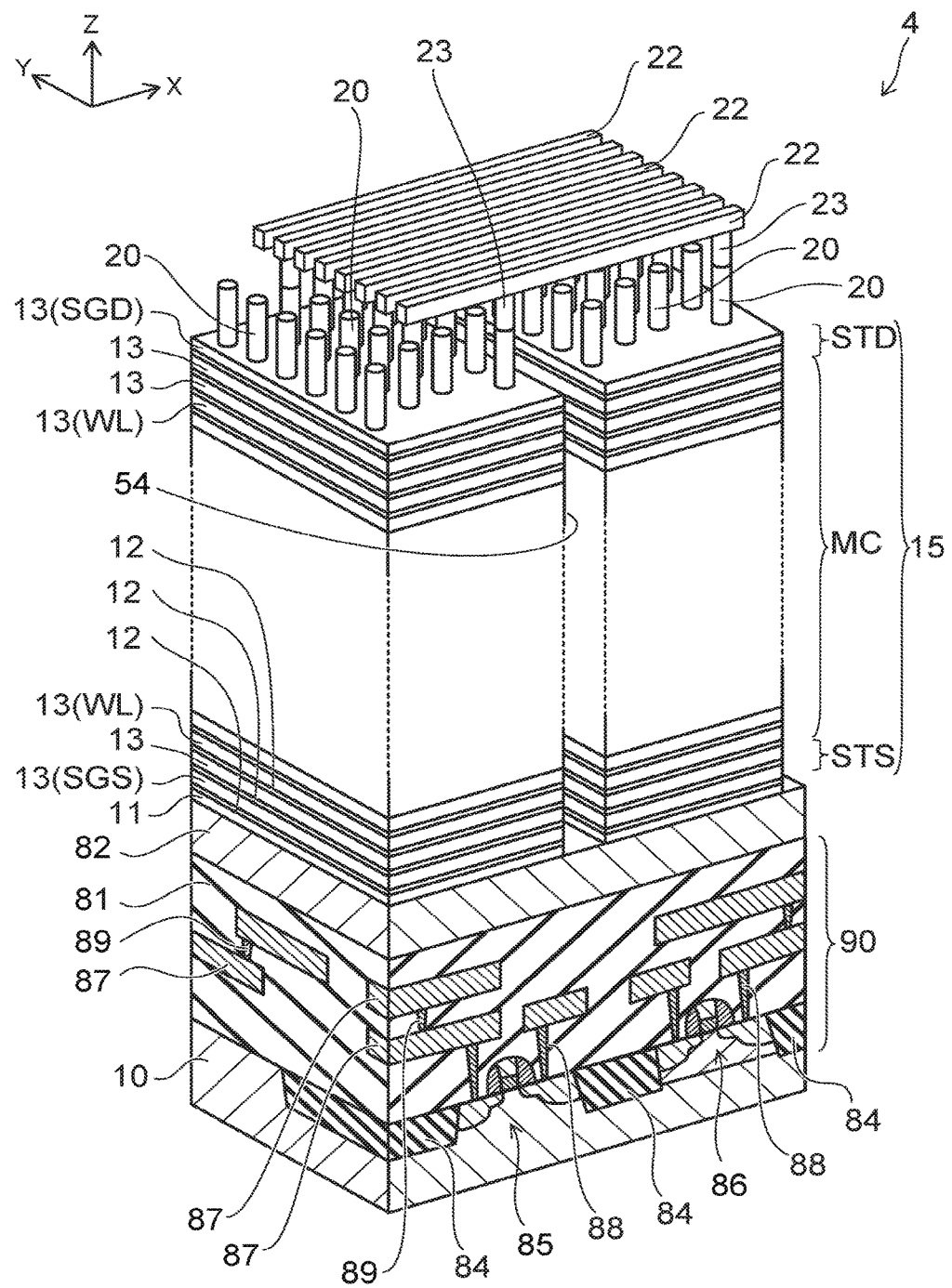
FIG. 16 is a cross-sectional view showing a semiconductor memory device according to a fourth embodiment.

FIG. 16 is a perspective view showing a semiconductor memory device according to the embodiment.

As shown in FIG. 16, in the semiconductor memory device 4 according to the embodiment, a below-cell circuit

90 is provided below the memory cell array in addition to the configuration of the semiconductor memory device 1 according to the first embodiment described above (referring to FIG. 1).

A specific description is as follows.

In the semiconductor memory device 4, an inter-layer insulating film 81 and a source electrode film 82 are provided between the silicon substrate 10 and the stacked body 15. For example, the inter-layer insulating film 81 is formed of silicon oxide; and, for example, the source electrode film 82 is formed of polysilicon to which an impurity is added. The silicon pillar 20 is connected not to the silicon substrate 10 but to the source electrode film 82. The source electrode film 82 is insulated from the silicon substrate 10 by the inter-layer insulating film 81. Also, the source electrode film 82 is provided to be connected commonly to multiple stacked bodies and is further connected to, for example, a source line (not shown) of a lower layer.

Also, the below-cell circuit 90 is formed inside the inter-layer insulating film 81 and the upper layer portion of the silicon substrate 10. The below-cell circuit 90 is a portion of the drive circuit that performs the programming, reading, and erasing of data to and from the memory cell transistors MC and includes, for example, sense amplifiers.

For example, the upper layer portion of the silicon substrate 10 is partitioned into multiple active areas by a STI (Shallow Trench Isolation) 84; a p-type MOSFET (Metal-Oxide-Semiconductor Field-Effect Transistor) 85 is formed in one active area; and an n-type MOSFET 86 is formed in another active area. Also, multiple levels of interconnects are provided inside the inter-layer insulating film 81; contacts 88 that connect the interconnects 87 to the silicon substrate 10 are provided; and vias 89 that connect the interconnects 87 to each other are provided. The depictions of the p-type MOSFET 85, the n-type MOSFET 86, the interconnects 87, etc., in FIG. 16 are schematic and do not necessarily match the sizes and dispositions of the actual elements.

Also, the source electrode plate 17 described in reference to FIG. 1 is not provided inside the slit 54 of the semiconductor memory device 4; and the source line 21 that is connected to the upper end of the source electrode plate 17 also is not provided. For example, an insulator (not shown) such as the silicon oxide plate 18 described in reference to FIG. 2 is filled into the slit 54. The potential necessary for driving is supplied from the below-cell circuit 90 to the source electrode film 82.

According to the embodiment, the space between the silicon substrate 10 and the stacked body 15 can be utilized effectively; therefore, the surface area of the circuit disposed at the periphery of the stacked body 15 can be reduced by this amount. Also, the source electrode plate 17 and the source line 21 can be omitted. As a result, even higher integration of the semiconductor memory device 4 is possible. Otherwise, the configuration, the manufacturing method, and the effects of the embodiment are similar to those of the first embodiment described above.

According to the embodiments described above, a semiconductor memory device having high integration and a method for manufacturing the semiconductor memory device can be realized.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention. Additionally, the embodiments described above can be combined mutually.

What is claimed is:

1. A semiconductor memory device, comprising:
    a stacked body including a plurality of electrode films and air gaps, the plurality of electrode films being disposed to be separated from each other along a first direction, each of the air gaps being made between the electrode films;
    a semiconductor pillar extending in the first direction and piercing the stacked body;
    a plurality of charge storage films provided between the semiconductor pillar and the plurality of electrode films, the plurality of charge storage films being partitioned every electrode film;
    a substrate disposed on the first-direction side of the stacked body;
    a plurality of conductive members piercing the stacked body and being connected to the substrate;
    a plurality of capping films disposed between the conductive member and the plurality of electrode films; and
    an insulating film disposed between the charge storage films, between the electrode films, between the capping films, and between the capping film and the conductive member, the insulating film being formed of an insulating material different from a material of the capping film,
    the air gaps being made inside the insulating film.

2. The semiconductor memory device according to claim 1, wherein a distance between the semiconductor pillar and one of the air gaps is shorter than a distance between the semiconductor pillar and one of the electrode films.

3. The semiconductor memory device according to claim 1, wherein a distance between the semiconductor pillar and an end of one of the air gaps on a side distal to the semiconductor pillar is longer than a distance between the semiconductor pillar and an end of one of the electrode films on the side distal to the semiconductor pillar.

4. The semiconductor memory device according to claim 1, further comprising an insulating film,
    the air gaps being made inside the insulating film.

5. The semiconductor memory device according to claim 4, wherein the charge storage film is formed of an insulating material different from a material of the insulating film.

6. The semiconductor memory device according to claim 5, wherein the charge storage film includes silicon and nitrogen, and the insulating film includes silicon and oxygen.

7. The semiconductor memory device according to claim 1, wherein a configuration of each of the conductive members is a plate configuration, and a length of the conductive member in a third direction is longer than a length of the conductive member in the first direction and a length of the conductive member in a second direction, the plurality of conductive members being arranged in the second direction, the third direction intersecting both the first direction and the second direction.

8. The semiconductor memory device according to claim 1, wherein
    a distance between the semiconductor pillar and one of the air gaps is shorter than a distance between the semiconductor pillar and one of the electrode films, and a distance between one of the conductive members and one of the air gaps is shorter than a distance between one of the conductive members and one of the electrode films.

9. A semiconductor memory device, comprising:
a stacked body including a plurality of electrode films and air gaps, the plurality of electrode films being disposed to be separated from each other along a first direction, each of the air gaps being made between the electrode films;
a semiconductor pillar extending in the first direction and piercing the stacked body;
a charge storage film provided between the semiconductor pillar and the electrode films; and
a plurality of capping films disposed to be separated from each other along the first direction,
the electrode films being disposed respectively between the charge storage film and the capping films.

10. The semiconductor memory device according to claim 9, wherein the capping films contact the electrode films.

11. The semiconductor memory device according to claim 9, wherein
a distance between the semiconductor pillar and one of the air gaps is shorter than a distance between the semiconductor pillar and one of the electrode films, and
a distance between the semiconductor pillar and an end of one of the air gaps on a side distal to the semiconductor pillar is longer than a distance between the semiconductor pillar and an end of one of the electrode films on the side distal to the semiconductor pillar.

12. The semiconductor memory device according to claim 11, wherein the distance between the semiconductor pillar and the end of one of the air gaps on the side distal to the semiconductor pillar is shorter than a distance between the semiconductor pillar and an end of one of the capping films on the side distal to the semiconductor pillar.

13. The semiconductor memory device according to claim 9, further comprising an insulating film disposed between the electrode films and between the capping films, the insulating film being formed of an insulating material different from a material of the capping films,
the air gaps being made inside the insulating film.

14. The semiconductor memory device according to claim 9, wherein the charge storage film is partitioned every electrode film.

15. The semiconductor memory device according to claim 14, further comprising:
a substrate disposed on the first-direction side of the stacked body;
a conductive member connected to the substrate and provided on two sides of the stacked body in a second direction, the second direction intersecting the first direction; and
an insulating film disposed between the electrode films and between the capping films, the insulating film being formed of an insulating material different from a material of the capping films,
the air gaps being made inside the insulating film,
a distance between the semiconductor pillar and one of the air gaps being shorter than a distance between the semiconductor pillar and one of the electrode films,
a distance between the conductive member and one of the air gaps being shorter than a distance between the conductive member and one of the electrode films.

\* \* \* \* \*